United States Patent
Plankenhorn et al.

(10) Patent No.: US 6,168,678 B1
(45) Date of Patent: Jan. 2, 2001

(54) METHOD AND DEVICE FOR STACKING SUBSTRATES WHICH ARE TO BE JOINED BY BONDING

(75) Inventors: Horst Plankenhorn, Villingen-Schwenningen; Thomas Lindner, Königsfeld, both of (DE)

(73) Assignee: Mannesmann Kienzle GmbH, Villingen-Schwenningen (DE)

( * ) Notice: Under 35 U.S.C. 154(b), the term of this patent shall be extended for 0 days.

(21) Appl. No.: 08/196,126

(22) PCT Filed: Jun. 11, 1993

(86) PCT No.: PCT/EP93/01480

§ 371 Date: Apr. 8, 1994

§ 102(e) Date: Apr. 8, 1994

(87) PCT Pub. No.: WO93/26040

PCT Pub. Date: Dec. 23, 1993

(30) Foreign Application Priority Data

Jun. 17, 1992 (DE) ................................................ 42 19 744

(51) Int. Cl.[7] ........................... B32B 31/26; B32B 35/00; H01L 21/68; B65G 49/07

(52) U.S. Cl. .......................... 156/64; 156/359; 156/362; 156/556; 156/583.1

(58) Field of Search .............................. 156/64, 350, 359, 156/362, 363, 364, 556, 583.1; 228/180.21, 6.2, 44.7, 49.1

(56) References Cited

U.S. PATENT DOCUMENTS

| | | | |
|---|---|---|---|
| 3,982,979 | * 9/1976 | Hentz et al. | 156/73.6 |
| 4,070,229 | * 1/1978 | Hentz et al. | 156/556 |
| 4,257,274 | 3/1981 | Shimada et al. | 73/718 |
| 4,669,866 | * 6/1987 | Phillips | 355/43 |
| 4,795,518 | * 1/1989 | Meinel et al. | 156/285 |
| 4,938,654 | 7/1990 | Schram | 414/757 |
| 5,062,149 | * 10/1991 | Hulderman et al. | 455/323 |
| 5,079,070 | * 1/1992 | Chalco et al. | 156/233 X |

* cited by examiner

Primary Examiner—Curtis Mayes
(74) Attorney, Agent, or Firm—Brown & Wood, LLP

(57) ABSTRACT

A method and an apparatus are proposed in order to bond multilayered substrate packages over a large surface at uniform heating in the course of one single work step, wherein the structured substrates are to begin with aligned to one another with high precision to correspond to the structuring in a working area separate from the heating apparatus.

8 Claims, 2 Drawing Sheets

METHOD AND DEVICE FOR STACKING SUBSTRATES WHICH ARE TO BE JOINED BY BONDING

Figure 1:
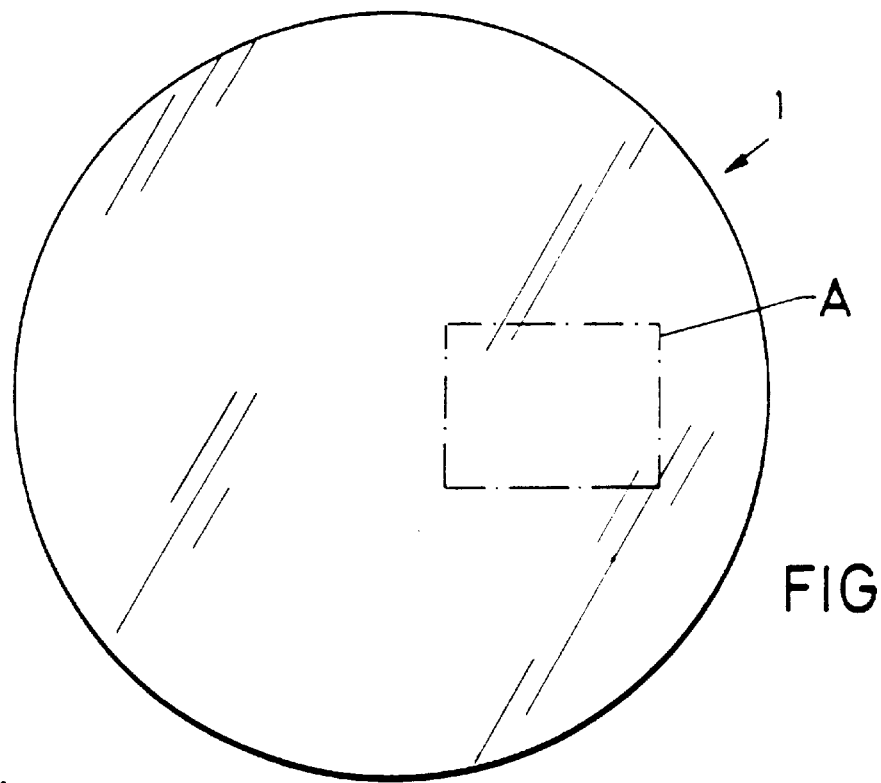

The subject of the invention is used in particular when fabricating sensors built up in laminar construction. Thus for instance pressure- or acceleration-sensors can be manufactured in a particularly advantageous manner by means of stacked substrates, wherein the substrates or substrata have previously been processed in a suitable manner, meaning they have been provided with specific delicate structures.

In order to now connect the substrates to one another, various technologies have already been developed. At this time we will only mention the following methods known to the specialized community without any more precise explanations:

anodic bonding
silicon fusion bonding
eutectic bonding
low temperature glass bonding All these bonding methods require that the surface of the substrates must be polished and thoroughly cleaned, that the substrates to be bonded to one another therefore must be manipulated in as particle-free an environment as possible, that they must meet very tight specifications as far as the evenness or flatness of the contact faces of the individual substrates is concerned and that the interconnection of the substrates must occur so that they remain free of mechanical stresses, in order to prevent void-like free spaces in between the substrates. The non-observance of these basic requirements considerably reduces the quality of the surfaces to be joined to one another. It can even put into question the intended function of the product to be fabricated.

The present invention will be described in the following for better understanding by way of an example of the method of anodic bonding. Although it is naturally not limited to this specific method, it can rather be used with other bonding methods.

Anodic bonding serves for establishment of a hermetic and mechanically solid connection between glass- and metal-substrates or a connection between glass- and semiconductor-substrates. For this purpose the stacked one-upon-the-other substrates must be heated to a temperature of several hundred ° C. and a DC voltage of about 1000 Volts must be applied to them. Electrostatic forces and the migration of ions lead finally to an irreversible chemical bond at the boundary layer between the individual substrates.

This fabrication method is for instance used in the fabrication of acceleration sensors or accelerometers. Structures in the range of micrometers can be placed in a semiconductor substrate or substratum by anisotropic etching. Herein in many application cases the substrates are not etched through their entire thickness, so that the substrate remains "non-transparent". A semiconductor structured in such a way is covered on both sides by glass substrates for obtaining a functional sensor, wherein the glass substrate also mostly has delicate structures on the side facing the semiconductor substrate, wherein for instance conductor parts and contact strips for the sensor produced by metallizing or etched channels, which on their part must be oriented with respect to the active structures of the semiconductor substrate participating in the change of the measured magnitude.

In the fabrication of such multilayer substrate packages a problem occurs, if one or several of the substrates which have to be aligned with high precision to one another is or are not transparent.

Methods and devices are known which perform the construction of a substrata package consisting of several substrates in a layered manner, by to begin with aligning a glass layer with the semiconductor substrate and connect same by bonding and thereupon turn the thus constituted two layer package, in order to subsequently apply the second glass layer to the other surface of the semiconductor substrate.

However this method has several disadvantages. On the one hand glass and semiconductor materials have different coefficients of thermal expansion, so that in the course of the initial bonding of the intermediate layered packets same bends in accordance with the bimetallic spring principle. The unevenness caused by the arching must be compensated by a compressive force during the alignment of the second glass substrate. In this method it is thus unavoidable, that the thus fabricated multilayer package warps in an unsymmetrical manner.

Devices for performing the described method have often a heating arrangement, which is designed in such a way, that the substrate package to be bonded is heated only from one side. During the first bonding process the semiconductor substrate is for instance placed upon a heating plate, during the second bonding process the glass substrate is then placed upon the heating plate. The glass substrate however has a considerably lower heat conductivity than the semiconductor substrate. Thus the temperature of the boundary layers to be bonded are in both cases different. A temperature regulation at the bonding surface does not result in any improvement, since the differing temperatures of the heating device again cause warping of the substrate package in a disadvantageous manner.

Another disadvantage in the described known device for performing the fabrication method consists in that in the course of the second bonding process the first substrate package is subjected to an electric pole reversal, since the heating plate is usually connected solidly to the cathode potential due to the construction of this apparatus. The anode contacts should however always be applied to the semiconductor substrate. An impairment of the mechanical properties of the first bond connection cannot be completely excluded by the chemical process at the boundary surface triggered by reversal of the poles.

The present invention is now based upon the task of creating a method and an appropriate device, in order to bond substrates, which have approximately the same surface area and of which at least one is not transparent, with one another while observing a very high adjustment or alignment accuracy to one another in accordance with their structure, wherein cycle times must be achieved, which are suitable for a series fabrication of the substrate packages to be bonded.

As a marginal condition the solution must take account, that the device must meet all those requirements which apparatus used in a clean room must satisfy. Freedom from particles is especially one of those, meaning it has to be assured that none of the components of the device produces particles. Thus for instance no guides causing abrasion wear can be used in the transportation means and if pneumatic drives are used the waste air must be directed below the working surface.

The discovered solution solves the problem as defined in an advantageous manner and completely avoids the disadvantages of the known methods and devices. The separation in space of the adjustment- and heating-units is particularly expedient. The adjustment unit, which aligns the position of the substrate with an accuracy of a few micrometers, is thus not exposed to the high temperatures required for bonding. The length- and volumetric-expansion of the means for receiving and retaining the substrate as well as that of the substrates themselves would, at the required temperatures, be of the same order of magnitude as the adjustment accuracy required due to the width of the structures or it would even exceed these. Therefore, in the invention the extremely accurate alignment of the substrates to one another corresponding to their structure is performed in a first working region of a handling device. Thereupon the substrates are then conveyed to another working region of the handling device by a transport arrangement and are there deposited one upon the other in the defined manner, prior to all the substrates being fed together to a heating device in the form of a substrate package containing them in an aligned manner.

All the superimposed substrates are simultaneously bonded in only one work step, wherein the disadvantages of the thermal warping by stepwise bonding are completely eliminated and the fabrication period is considerably shortened. The bonding is a fabrication step requiring the most time in the entire fabrication process. This measure decisively shortens the cycle time in a fabrication in series, especially if the heating device is laid out so that it can simultaneously accept several substrate packages. Through the simultaneous bonding of all boundary layers of the substrate package the consequences which arise by pole reversal of previously bonded layers are also avoided.

In the following the invention will be described with particularity using an embodiment example and three Figures.

Figure 2:
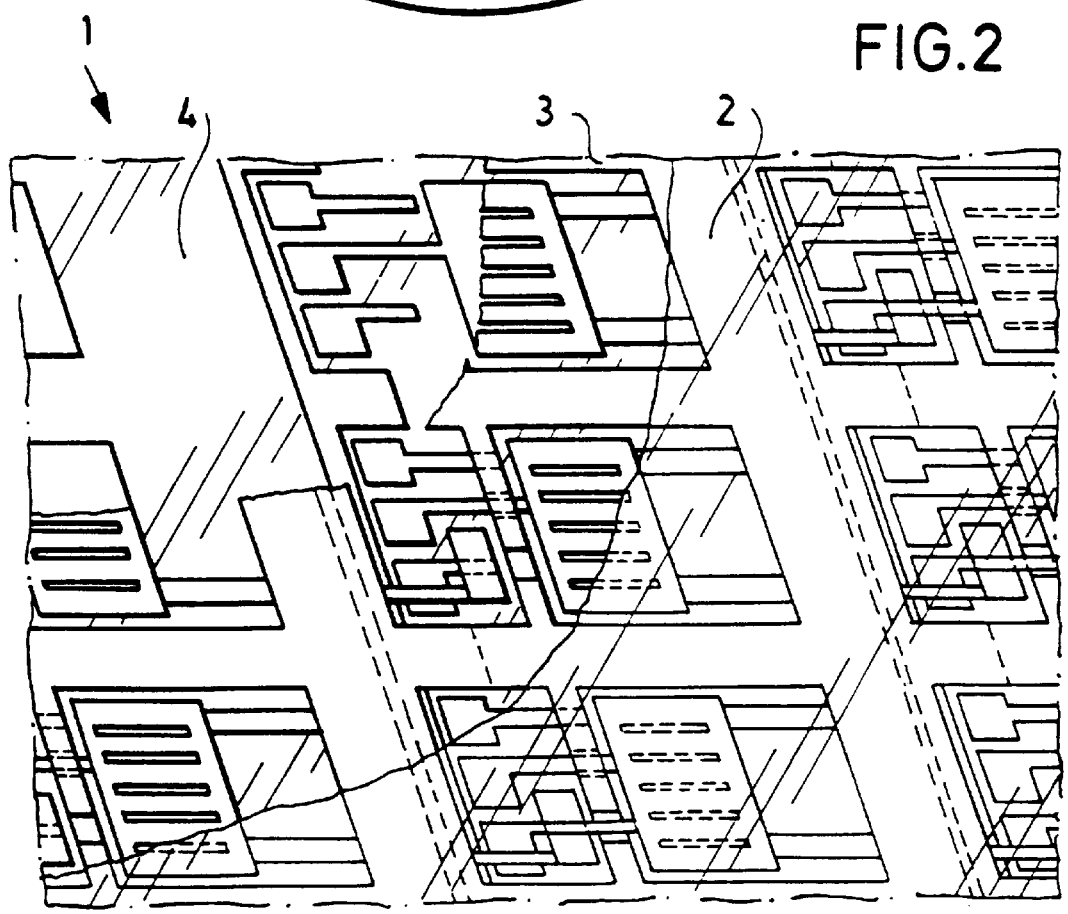

FIG. 1 shows a substrate package 1 in plan view. In FIG. 2 a cutout A from the substrate package in FIG. 1 is shown at a larger scale, wherein additionally the layered build-up of three substrates 2, 3 and 4 with the delicate and complex structures applied to them or on them can be seen by means of the folded-back cut. These two Figures clarify the problem arising if these substrates are to be placed upon one another in the defined manner and if at least one of the substrates is not transparent, as in this case for instance substrate 3.

Figure 3:
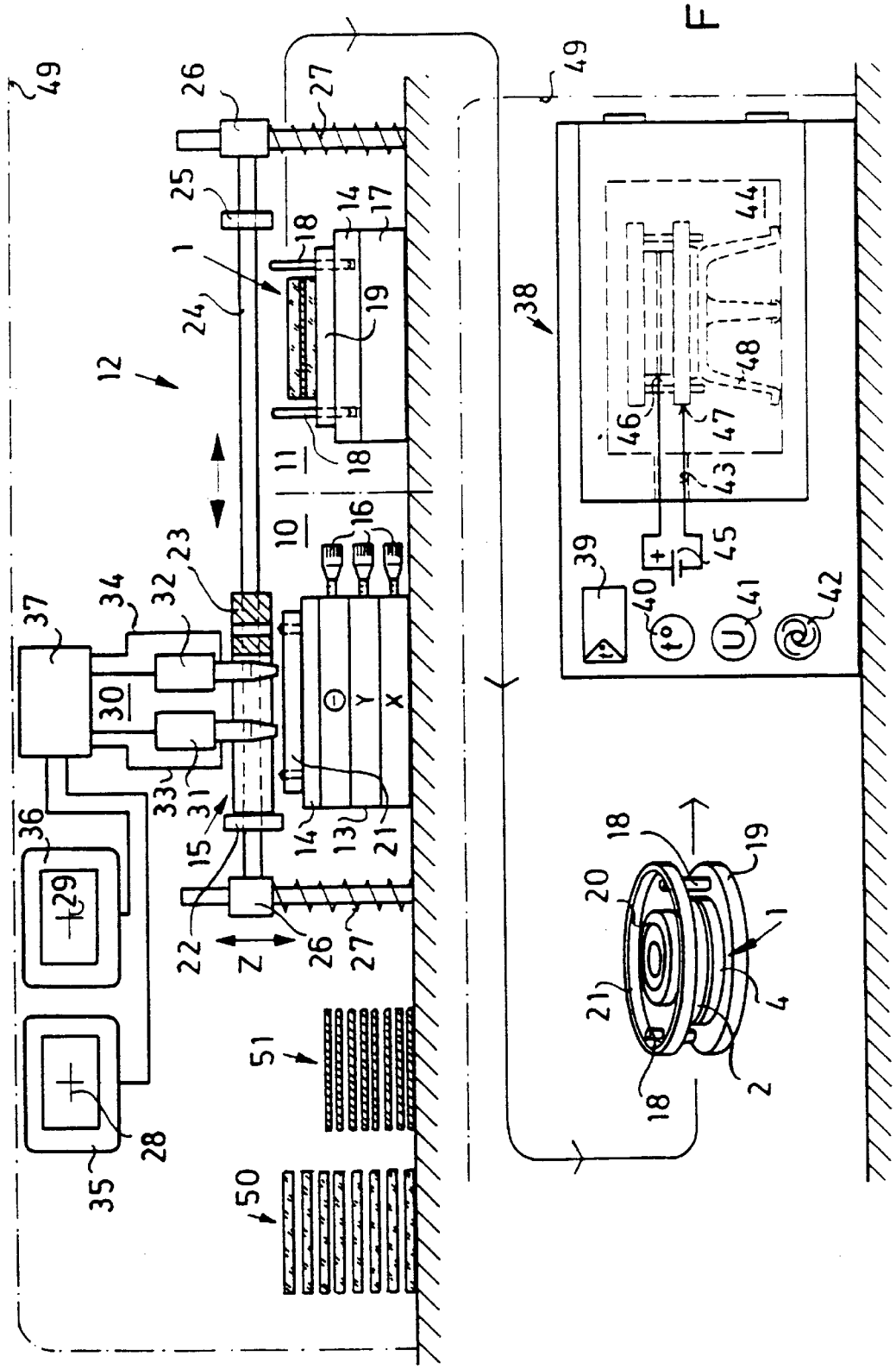

FIG. 3 shows diagrammatically the apparatus or device in the invention for performing the process.

The method is subdivided into the following essential work steps:

Adjustment

Transportation

Stacking

Bonding

The adjustment or alignment of a substrate is performed in a first working area 10 of a handling device 12, so as not to expose the mechanical components of the alignment unit to a high thermal stress. Apart from increased wear and a considerably more expensive construction of the entire handling device 12, it would be otherwise extremely difficult at temperatures of 300° C. to observe the required adjustment accuracy of less than 10 micrometers in a reproducible manner.

The handling device 12 has two working areas 10 and 11, with means 14 for receiving and retaining the substrates provided in each of them; conveyance means 15 connecting the two working areas 10 and 11 to one another making it possible to convey one substrate from the first to the second working area as well as depositing it there in a defined manner are also provided.

Receiving means 14 in the first working area 10 consist for instance of a disk-shaped chuck, upon which a substrate is deposited either manually or automatically and retained there by means of negative pressure, as soon as the vacuum suction has been activated. The means for vacuum suction are not shown in FIG. 3.

The vacuum chuck for receiving the substrate in the first working area 10 is supported on an xy-coordinate table 13 rotatable through 360°. The positionings are achieved by means of precision drives 16. Thus the displacement accuracy for both axes amounts to 1 micrometer. Rotationally an adjustment accuracy of 0.1° is attained.

A depository table 17 is provided in the second working area 11 upon which the lower portion of the substrate receptacle rests so as to be arrested or located by two alignment pins 18. The substrate receptacle 19 consists of a plate made from an electrically conductive material as well as being provided on the side of the substrate with channels for suction by negative pressures and on the rear side with a fixedly attached magnet 20. A symmetrical matching piece 21 is also deposited guided by the alignment pins upon the substrate receptacle 19 and it holds the interposed substrate package 1 together by means of magnetic attraction. The two retaining plates 19 and 21 are connected to one another in an electrically conductive manner by means of the two alignment pins 18. The two glass substrates 2 and 4 resting at the retaining plates 19 and 20 are thus contacted across a large area for the subsequent bonding process.

In order to avoid thermal warping in the substrate package 1 which is to be bonded, it is advisable to make the means 19 and 21 for receiving and retaining the substrates out of a material whose coefficient of thermal expansion corresponds as mush as possible to that of the substrate. The temperature coefficients of the substrates to be bonded to one another are however as a rule different, however they are mostly of the same order of magnitude. It assists greatly in improving the quality of the bonding connection, if the material is selected for the substrate receptacles, whose coefficient of thermal expansion approaches this order of magnitude as much as possible, in order to avoid thermal warping due to heating the entire package.

The conveyance means 15 for conveying the substrate from the first to the second working area consists for instance of a fork-shaped transportation sled 23 whose fork is open toward the left hand side, as shown in the sectioned illustration in FIG. 3, so as not to collide with the microscope system 31, 32. The sled is also equipped with means for receiving the substrate by vacuum suction, which however are not shown in FIG. 3. The transportation sled 23 is supported with little friction upon longitudinal guides 24 and can be moved in between fixed stops 22 and 25. A hoisting or lifting device 26 is additionally provided in order to lower the transportation sled 23 down to the adjustment table 13 in the first working area 10 or down to the depository table 17 in the second working area 11. In order to limit the contact force of the sled 23 against the table the hoisting force Z acts against a spring 27.

The problems arising during alignment of the substrate result from the circumstance, that the semiconductor substrate at least is not transparent. Therefore the solution in the invention proposes to orient or align each substrate relative to nominal positions. Cross hairs 28, 29 in a stationary microscope system 30 are preferably used for this purpose.

In the preferred embodiment two alignment or test marks of the substrate are imaged by a Splitfield microscope. A Splitfield microscope has the property of simultaneously producing more image alignment or test marks separated in space. In this case it consists of two reflected light microscopes 31 and 32 with coaxial polarized light travel, which are illuminated by a cold light source through optical fibers 33, 34. The two reflected light microscopes 31 and 32 with a lens having a 10-fold magnification are mounted for instance upon a traverse and their optic parameters can be varied. The image proper is produced by a semiconductor camera respectively on one each monitor 35, 36 as an image carrier. Displaceable or adjustable vertical and horizontal measuring lines are faded-in or superimposed upon the image of the substrate by two cross hair transmitters. These constitute the stationary nominal positions, according to which the substrate is aligned in the first working area 10. In FIG. 3 the individual components cold light source, semiconductor camera and the control unit required for operating this apparatus are combined in the field 37.

The alignment marks of the substrate are formed either by the active structures of the substrate itself or structures applied on or into the substrate expressly for the alignment process are used. The actual positions to be observed on the monitors 35 and 36 are adjusted to the nominal positions predetermined by the cross hairs 28 and 29 by means of the precision drives 16 of the coordinate table 13.

In order to be able to meet the required alignment accuracy, a high mechanical stability of the handling device 12 is necessary. Here the spacing between the microscope and the substrate receptacle has to be especially mentioned, as also the reproducibility of the positioning of the transportation sled 23 at the fixed stops 22 and 25.

The pickup and depositing of the substrate must equally be performed in an exactly defined manner, meaning with extreme positional accuracy. For this purpose the conveyance sled 23 travels out of its inactive position over the depositing table 17 in the second working area 11 of the handling device 12 to the left fixed stop 22 above the alignment table 13 in the first working area 10. There it is lowered until its means for receiving the substrates come to rest upon the aligned substrate which has to be transported. A control circuit which is not shown in FIG. 3, monitors the pickup of the substrate by means of vacuum suction by the substrate receiving means of the transportation sled 23, since at the same time the retention of the substrate in the alignment unit must be disconnected. The s witching point at which a substrate is retained either by the transportation sled 23 or by the alignment unit can be variably adjusted.

After a substrate has been picked up by the transportation sled 23, the sled 23 is raised and travels as far as the righthand fixed stop 25 in the second working area 11 of the handling device 12, where the sled is lowered upon the depository table 17. Only the first substrate which is to be deposited in the second working area is aspirated there by vacuum of the receptacle existing at that point, wherein the transition from disconnection in the retaining means of the transportation sled 23 for holding the substrate upon the depository table 17 proceeds in a controlled manner similar to what occurred in the first working area 10. All additional substrates are only placed upon the previous substrate, wherein, prior to the upward travel of the transportation sled 23 into its position of rest, an adjustable time delay between the lowering process and disconnecting the vacuum is provided in order to eliminate the air cushion between the substrates.

Once all desired substrates have been stacked one above the other on the depository table 17 in a manner as is shown in FIG. 3, the top holding plate 21 guided by the alignment pins 18 is placed upon the substrate package 1. This upper holding plate 21 thus requires no alignment markers. It is held by magnetic attraction. The entire package consisting of stacked substrates and the holding plates 19 and 21 embracing the stack is now directed to a heating device 38. A temperature regulation circuit 39 maintains the adjusted temperature within an accuracy of at least 1° C. It is expedient that the heating device 38 has a temperature indictor 40 and a display instrument 41 for the bonding voltage supplied from the high voltage source 45 as well as means 42 for uniform heating of the substrate package on all sides. The method in the invention however does not depend upon these components being integrated or not into the heating device 38.

The heating device 38 comprises also a high voltage passage 43 into the heating space 44 proper of the heating device 38, in order to supply the electric energy from a high voltage source 45 required for bonding the substrate package 1 located in the heated space 44. Means 46, 47 are provided in the heating device for electrically contacting the substrate package, which means connect the anode of the DC voltage source 45 through a contact to the semiconductor substrate 3 and connect the glass substrate 2, 4 to the cathode across a large area. Multilayered substrate packages can be advantageously bonded simultaneously in this way in only one work step. It could be advantageous to deposit the substrate package on an auxiliary stand 48 in the heating space 44.

The dash-dot bordering 49 of all the units in the device for performing the method in the invention is meant to indicate that these device units are operated in a clean room environment. This applies particularly to the handling device 12 and the substrates to be fed to same. FIG. 3 shows in outline two stacks 50 and 51 of different types of substrates, for instance glass substrates 2 and 4 and semiconductor substrate s 3, which are made available in a magazine or another suitable container not shown here for further treatment at the handling unit 12. After the substrates have been stacked one upon another and embraced by the two substrate receptacles 19, 21 in a dust-proof manner, the heating device 38 can be placed in proximity of the handling device 12 also within the clean space according to purely practical aspects, in order to possibly enable charging of the heating space 44 by a widening in the handling device 12. This embodiment is expedient, as far as the disposition of the heating device 38 is concerned, however contrary to the disposition of the handling device 12 for performing the inventive method, it is not absolutely required.

The apparatus created in this manner can completely fulfill the requirements of bonding multilayered substrate packages across large areas and with small cycling times in a manner suited for series fabrication of sensors at uniform heating, wherein the structured substrates have been previously aligned to one another with high accuracy corresponding to their structuring in a working area separate from the heating device. All described measures for the solution in the invention assist in achieving overall an alignment accuracy of 10 micrometers or better in a reproducible manner in the substrate packages to be bonded after termination of all process steps.

The proposed solution is suitable for automatic fabrication, since pneumatic or electric drives can easily be used for the mechanical movement sequence and even the alignment can, if need be, be performed fully automatically by electronic image evaluation with subsequent positional regulation of the substrate receptacle in the alignment unit. Equally the apparatus can be built up in a manner suitable for use in clean rooms, wherein all aspects of the task definition are met.

What is claimed is:

1. A method of stacking a plurality of structured substrates to be aligned with one another corresponding to structuring thereof and connected undetachably to one another by bonding, with the substrates having approximately same surface area and with at least one substrate being non-transparent, said method comprising the steps of:

providing a substrate handling device having spaced first and second working areas and substrate receiving means provided at each of the first and second working areas;

aligning the substrates in the first working area of the handling device, said aligning step including directing a microscope upon substrates, arranged on the receiving means of the first working area, for generating two spatially separated alignment marks of a substrate on an image carrier, with the alignment marks being formed by one of active structures of the substrate itself and by independent markings, and changing an actual position of the substrate by rotating and displacing the receiving means until an image of the alignment marks coincides with a nominal position present upon the image carrier;

thereafter, transporting the substrates to the second working area of the handling device and depositing the substrates one upon another in accordance with alignment thereof to form a substrate package; and transporting the substrate package to a heating device for uniform heating of all sides of the package to effect simultaneous bonding of the substrates in a single work step.

2. An apparatus for stacking a plurality of structured substrates to be aligned with one another corresponding to structuring thereof and connected undetachably to one another by bonding, with the substrates having approximately same surface area and with at least one substrate being non-transparent, said apparatus comprising:

a substrate handling device having spaced first and second working areas;

first means for receiving and retaining a substrate in said first working area of the handling means;

alignment means located in said first working area for supporting said first receiving and retaining means, said alignment means comprising a coordinate table having precision drive means for effecting displacement of said first receiving and retaining means along three mutually perpendicular coordinates for changing an actual position of the substrate supported in said first receiving and retaining means for aligning the substrate;

microscope means provided in said first working area for imaging two spatially separated alignment marks on the substrate supported in said first receiving and retaining means;

second means located in said second working area for receiving and retaining aligned substrates to be deposited one upon another;

means for transporting the substrates aligned in said first working area to said second working area and for depositing the aligned substrates onto said second receiving and retaining means one upon another in accordance with alignment effected in said first working area; and means for uniformly heating on all sides a substrate package formed in said second working area for effecting simultaneous bonding of the substrates of the package in a single working step.

3. An apparatus as set forth in claim 2, wherein said microscope means comprises a Splitfield microscope for imaging and depicting the two spatially separated alignment marks simultaneously.

4. An apparatus as set forth in claim 2, wherein said second receiving and retaining means is formed of a material having a coefficient of thermal expansion which approximates to a coefficient of thermal expansion of the substrates.

5. An apparatus as set forth in claim 2, wherein said heating means includes a temperature regulating unit having a regulation accuracy of 1° C. or less.

6. An apparatus as set forth in claim 2, wherein a layout arrangement of said first and second receiving and retaining means, said microscope means, said transporting means, and said heating means is so selected that an alignment accuracy of the aligned substrates is less than 10 microns.

7. An apparatus as set forth in claim 2, wherein a substrate package is formed of multilayered glass-semiconductor glass substrates, wherein said heating means is adapted to receive a plurality of the substrate packages formed of multilayered glass-substrates, and wherein said heating means includes a high voltage source having an anode, which is connected to the semiconductor substrates, and a cathode, which is connected to the glass substrates.

8. An apparatus as set forth in claim 7, wherein cathode contacts have a large area when anodic bonding of glass substrates is effected.

* * * * *